United States Patent
Fu et al.

(10) Patent No.: US 7,940,150 B2
(45) Date of Patent: May 10, 2011

(54) SIX-DEGREE-OF-FREEDOM PRECISION POSITIONING SYSTEM

(75) Inventors: Li-Chen Fu, Taipei (TW); Sheng-Chih Huang, Taipei (TW); Shao-Kang Hung, Taipei (TW); Mei-Yung Chen, Taipei (TW)

(73) Assignee: National Taiwan University, Taipei (TW)

( * ) Notice: Subject to any disclaimer, the term of this patent is extended or adjusted under 35 U.S.C. 154(b) by 551 days.

(21) Appl. No.: 12/147,096

(22) Filed: Jun. 26, 2008

(65) Prior Publication Data

US 2009/0241719 A1 Oct. 1, 2009

(30) Foreign Application Priority Data

Mar. 25, 2008 (TW) ................................ 97110468 A (51) Int. Cl.
*H01F 1/00* (2006.01)
(52) U.S. Cl. ....................................... 335/296; 310/90.5
(58) Field of Classification Search .. 74/490.07–490.09; 356/500; 318/560; 310/90.5; 33/1 M, 568, 33/573, DIG. 1; 104/281, 286
See application file for complete search history.

(56) References Cited

U.S. PATENT DOCUMENTS

| | | | | |
|---|---|---|---|---|
| 5,267,091 A * | 11/1993 | Chen | ............................. | 359/872 |
| 6,003,230 A * | 12/1999 | Trumper et al. | ............... | 33/1 M |
| 6,369,400 B1 * | 4/2002 | Haeberle et al. | .............. | 250/548 |
| 6,639,225 B2 * | 10/2003 | Kirschstein et al. | ...... | 250/442.11 |
| 6,879,063 B2 * | 4/2005 | Frissen et al. | ............. | 310/12.05 |
| 7,185,590 B2 * | 3/2007 | Fu et al. | ......................... | 104/281 |
| 7,224,252 B2 * | 5/2007 | Meadow et al. | .............. | 335/296 |
| 7,336,344 B2 * | 2/2008 | Kimura | ........................... | 355/75 |
| 2005/0140326 A1 * | 6/2005 | Houkes et al. | ................. | 318/632 |
| 2009/0241719 A1 * | 10/2009 | Fu et al. | ...................... | 74/490.08 |

* cited by examiner

Primary Examiner — Ramon M Barrera
(74) Attorney, Agent, or Firm — Hoffmann & Baron, LLP (57) ABSTRACT

In a six-degree-of-freedom precision positioning system, magnetic force and fluid buoyancy are used to levitate a platform, and the non-contact magnetic force between electromagnets and magnets forms a main driving force for the platform. Therefore, no friction is present in the system and no lubricating mechanism is needed for the system. Moreover, in the system, electric current is converted by electromagnets and magnets into a magnetic driving force without using any transmission gears. Therefore, the backlash phenomenon that is not easily controllable in the conventional servo positioning systems is avoided. The system has simplified structure without the need of complicated fabrication, and utilizes the properties of fluid to achieve low power consumption, high precision positioning, and fast response.

10 Claims, 8 Drawing Sheets

SIX-DEGREE-OF-FREEDOM PRECISION POSITIONING SYSTEM

FIELD OF THE INVENTION

The present invention relates to a precision positioning system for the control or regulation of non-electric variables, and more particularly to a six-degree-of-freedom precision positioning system that utilizes feedback to control position or direction.

BACKGROUND OF THE INVENTION

A high-precision positioning system plays more and more important role in nowadays high technological fields, such as IC manufacturing process, home entertainment systems, including DVD and VCD players, etc. Currently, there are already developed many precision positioning technologies that adopt, for example, a piezoelectric actuator, which not only enables a definition as high as 10 nanometers within a travel distance of only 10 micrometers, but also has fast response. However, the piezoelectric actuator allows only a limited travel distance, and is therefore not suitable for the applications that require a relatively large travel distance. To meet the requirement for long travel distance, a traditional way is to use a servo motor and a cooperating lead screw, or to use a linear motor. However, since the lead screw is subject to the backlash phenomenon and the friction between bearings, the overall positioning precision is obviously lowered. On the other hand, the linear motor is subject to the ripple effects and the end-effects to thereby cause lowered positioning precision.

To overcome the above system problems, the use of a non-contact force is apparently a somewhat good solution. Among others, the pneumatic levitation system, the electrostatic levitation system, and the magnetic levitation system are the most common examples of utilization of non-contact force. However, the first two systems are not suitable for use in some special environments, such as dust-free room, vacuum environment, etc. Therefore, for the purpose of developing a high precision positioning system usable in a variety of environments, the present invention provides a system employing the magnetic levitation principle to construct its basic configuration. In recent years, more and more researches have been conducted to develop magnetic levitation systems. With the superior characteristics of the non-contact force, some of the technologies that have been considered as being unable to have further breakthrough could have remarkable development now. Some examples of such technologies include the wind tunnel system employed in aerospace and automobile industries, high-precision positioning system, big-scale speedy transiting system, bearings, and shock-absorbing system.

In the past, the inventors of the present invention had already developed a single-layer and single-axis magnetic levitation system as well as a dual-layer and dual-axis six-degree-of-freedom magnetic levitation system. While these two systems are theoretically and experimentally excellent, they still have some inherent defects that could not be easily overcome, such as low structural strength, complicated mechanism design, and relatively high power consumption. A currently available and relatively matured dual-axis magnetic levitation technology is the six-degree-of-freedom magnetic levitation positioning platform developed by Dr. Trumper of Massachusetts Institute of Technology in 1996 (referring to Won-jong Kim, David L. Trumper, "Active Multivariable Optimal Control of a Planar Magnetic Levitator.", *Proc. of the IEEE Int. Conf. on Control Application*, October 1997, and Trumper, D. L. and Kim, W.-J., "Magnetic Positioner Having a Single Moving Part", U.S. Pat. No. 6,003,230, Dec. 21, 1999.) The system of Dr. Trumper uses a linear motor as its basic configuration to simultaneously provide the vertical levitation force and the lateral driving force needed by the magnetic levitation system. However, this system involves in complicated and highly difficult fabricating procedures, and is therefore not easily widely accepted by related industrial fields.

Mr. Won-jong Kim, a student of Dr. Trumper, has also developed at University of Texas a new model of six-degree-of-freedom micro-actuator, which is now still in the research and development stage (referring to Won-jong Kim, "Precision Dynamics, Stochastic Modeling, and Multivariable Control of Planar Magnetic Levitator." *Proc. of the American Control Conf.*, May 2002, and S. Verma, K. Won-jong, and H. Shakir, "Multi-axis maglev nanopositioner for precision manufacturing and manipulation applications." *Industry Applications, IEEE Transactions* on, vol. 41, pp. 1159-1167, 2005). The system developed by Kim uses the magnetic effect between coils and permanent magnets to achieve motions in six degrees of freedom. While it is expected this system would be able to meet the requirement of high precision, the hardware mechanism design for this system is restricted by the inherent limitation in travel distance, and is therefore not suitable for applications involving a large travel distance.

Finally, Professor Menq of Ohio University also has developed a magnetic levitation positioning system (referring to S. Ximin, K. Shih-Kang, Z. Jihua, and M. Chia-Hsiang, "Ultra precision motion control of a multiple degrees of freedom magnetic suspension stage," *Mechatronics, IEEE/ASME Transactions* on, vol. 7, pp. 67-78, 2002). The system of Professor Menq utilizes the principle of linear motor to generate the lateral force and the large-scale electromagnetic coil to generate the vertical force. However, a biggest disadvantage of this system is its relatively complicated mechanism design and high manufacturing cost. Moreover, the system of Professor Menq has higher power consumption compared to the other two systems, and is therefore not economical for use.

In summary, the magnetic levitation positioning systems of prior art have one or more of the disadvantages of limited travel distance, complicated structural design, high manufacturing cost, and high power consumption. It is therefore tried by the inventor to develop a six-degree-of-freedom precision positioning system that has simple configuration, low manufacturing cost, low power consumption, and the ability of achieving long travel distance while providing high-precision positioning performance.

SUMMARY OF THE INVENTION

A primary object of the present invention is to provide a six-degree-of-freedom precision positioning system that utilizes the properties of fluid to enhance the controllability of a platform and largely reduce the power consumption by electromagnetic coils, and thereby achieves the purpose of low power loss in the system.

Another object of the present invention is to provide a six-degree-of-freedom precision positioning system that has large travel distance, precise positioning ability, and simplified as well as economical structural design.

To achieve the above and other objects, the six-degree-of-freedom precision positioning system according to the present invention includes a controller and a platform. The platform includes a hollow tank being filled with a type of fluid; a base being disposed above the hollow tank and having at least four through bores symmetrically formed thereon around a center of the base; at least four cylindrical electromagnets and at least four rectangular electromagnets being symmetrically disposed on the base around the center of the base; a carrier being located above a plurality of hollow columns that are supported by the fluid in the hollow tank, and the number of the hollow columns being the same as that of the through bores on the base; and at least eight permanent magnets being mounted to a lower surface of the carrier at positions corresponding to the cylindrical electromagnets and the rectangular electromagnets.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
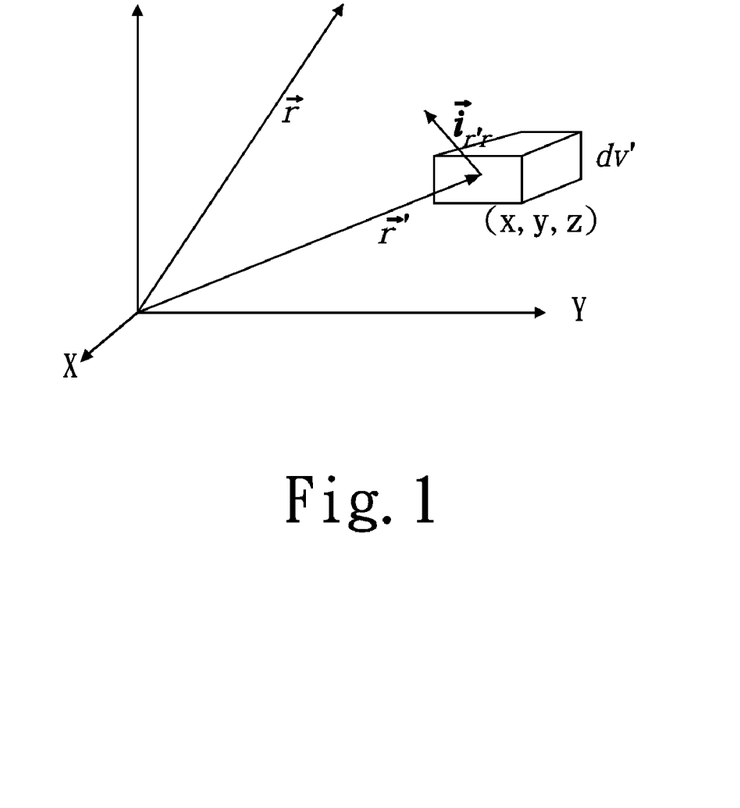
FIG. 1 shows the magnetic vector produced by an object in the space.

Please refer to FIG. 1. As a basic electromagnetism, the magnetic vector produced in a space by an object having an electric current flowed therethrough can be derived according to Biot-Savart Law and expressed by the following equation:

$$\vec{H} = \frac{1}{4\pi} \int_{v'} \frac{\vec{J}(\vec{r}') \times \vec{i}_{r'r}}{|r' - r|^2} dv' \quad (1)$$

where, $\vec{r}$ is the position vector of an observation point; $\vec{r}'$ is the surface current position vector; $\vec{J}(\vec{r}')$ is the density of current flowed through the coil; and $\vec{i}_{r'r}$ is the position vector of the observation point relative to the surface current.

Figure 2:
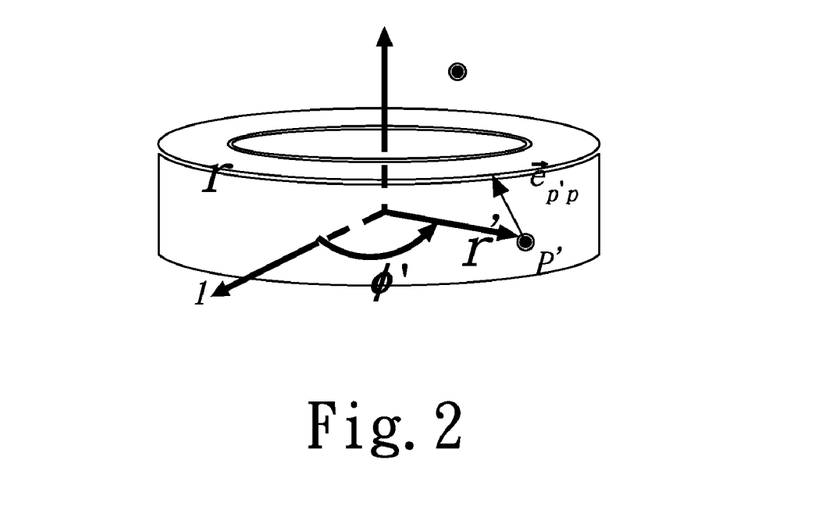
FIG. 2 shows the magnetic vector produced by a cylindrical electromagnet in the space.

The above equation (1) may be applied to a cylindrical electromagnet as that shown in FIG. 2, and to a rectangular electromagnet. In the case of a cylindrical electromagnet, the magnetic vector produced by the cylindrical electromagnet in the space can be expressed by the following equation:

$$\vec{H}_{cyl} = \frac{1}{4\pi} \int_{-h_1/2}^{h_1/2} \int_0^{2\pi} \int_{r_1}^{r_2} \left( \frac{NI_{cyl}}{(r_2 - r_1)h_1} \right) \frac{(\vec{e}_{\phi'} \times \vec{e}_{p'p})}{|\vec{p} - \vec{p}|^2} r' dr' d\phi' dz' \quad (2)$$

where, $h_1$ is the coil height; N is the number of coil turns; $r_2$ and $r_1$ represent the coil inner and outer diameters, respectively; and $I_{cyl}$ is the amount of current input to the coil. As can be easily found from the above, $\vec{H}_{cyl}$ is the product of a spatial position function and the magnitude of current, and may be otherwise expressed as below:

$$\vec{H}_{cyl} = \vec{h}_{cyl}(x,y,z) I_{cyl} \quad (3)$$

Similarly, the magnetic field produced by a rectangular electromagnet may be expressed as below:

$$\vec{H}_{rec} = \vec{h}_{rec}(x,y,z) I_{rec} \quad (4)$$

Figure 3:
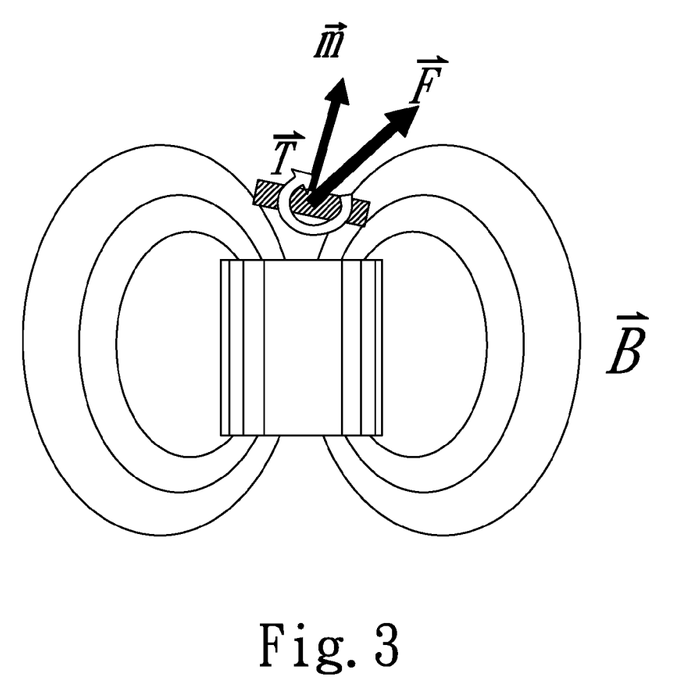
FIG. 3 shows the state of a permanent magnet subjected to force in a magnetic field space.

Please refer to FIG. 3. From the concept of Lorentz force, the force acted on a permanent magnet in a magnetic field may be derived as below:

$$\vec{F} = (\vec{m} \cdot \nabla) \vec{B} \quad (5)$$

where, $\vec{m}$ is the magnetic dipole vector of the magnet.

From the above equations (3) and (4), it can be easily found the magnetic force of the magnet in the magnetic field produced by the electromagnet can be expressed as below:

$$\vec{F} = \vec{g}(x,y,z) I \quad (6)$$

where, $\vec{g}(x,y,z)$ is a function of the relative position of the magnet to the electromagnet.

To efficiently obtain the relational expression of the $\vec{g}(x,y,z)$, the complicated theoretical derivation or the Finite Element Method (FEM) that requiring large amount of calculation is not adopted in the present invention to obtain the magnitude of force acted on the magnet in the coil. Instead, a high-precision load cell is used to measure the magnitude of force acted on the magnet in the coil. The measured force is then divided by the current value to obtain a distribution curve of the $\vec{g}(x,y,z)$.

Figure 4A:
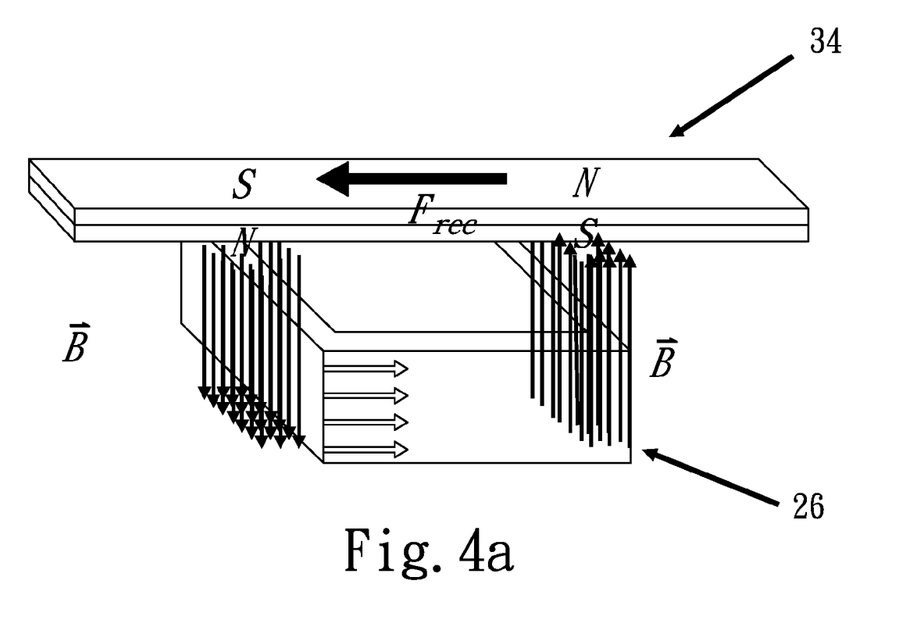
FIG. 4a shows the acting force between a rectangular electromagnet and a rectangular magnet.
Figure 4B:
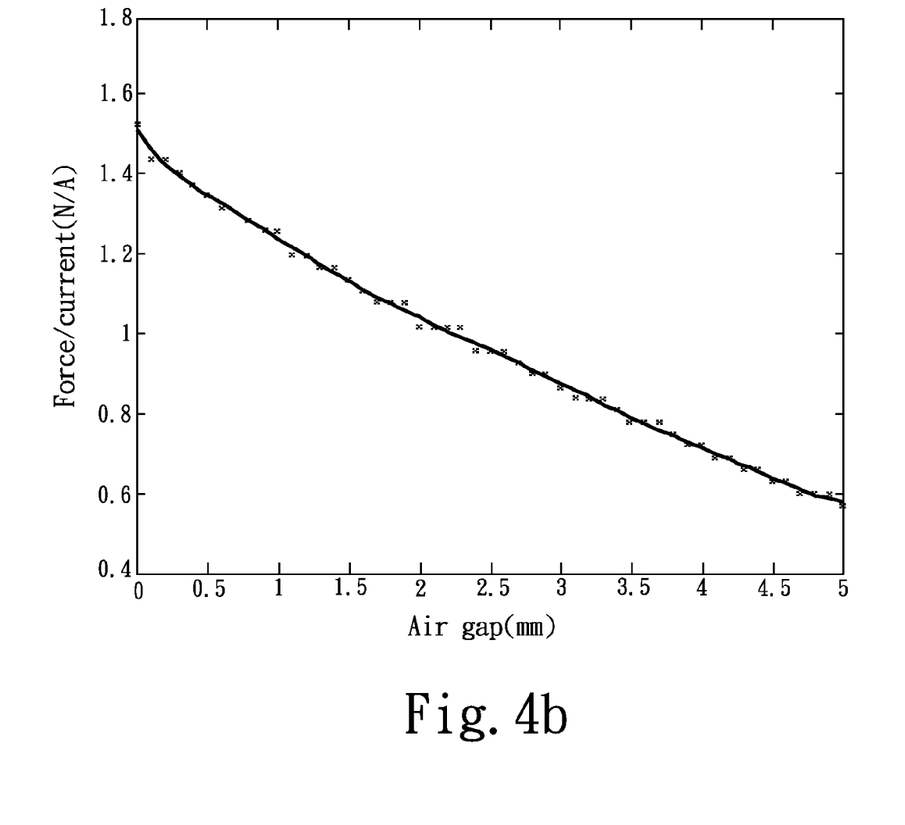
FIG. 4b is a curve showing the distribution of magnetic forces in a horizontal direction.

FIG. 4a shows the acting force between a rectangular electromagnet and a rectangular magnet, and FIG. 4b is a curve showing the distribution of magnetic force in a horizontal direction. Based on the above measured results, mathematic software Matlab is used to work out an optimal high-level polynomial expression to approach the curve obtained from experiments. Through the polynomial regression curve, the measured values are used to simulate the acting force between the rectangular electromagnet and the rectangular magnet as expressed below:

$$f_{rec} \approx K_{rec}(z) \cdot I_{rec} \quad (7)$$
$$\approx (k_{18} z^8 + k_{17} z^7 + k_{16} z^6 + k_{15} z^5 + k_{14} z^4 + k_{13} z^3 + k_{12} z^2 + k_{11} z + k_{10}) \cdot I_{rec}$$

where, $k_{18} = 3.296 \times 10^4$, $k_{17} = -6.8966 \times 10^3$, $k_{16} = 5.9341 \times 10^2$, $k_{15} = -2.7023 \times 10^1$, $k_{14} = 6.9848 \times 10^{-1}$, $k_{13} = -1.0247$, $k_{12} = 8.2791 \times 10^{-1}$, $k_{11} = -5.5795 \times 10^{-4}$, $k_{10} = 1.517$.

Therefore, the relational expression of $\vec{g}(x,y,z)$, which is the function of the relative position of the rectangular electromagnet to the rectangular magnet, is obtained.

Figure 5A:
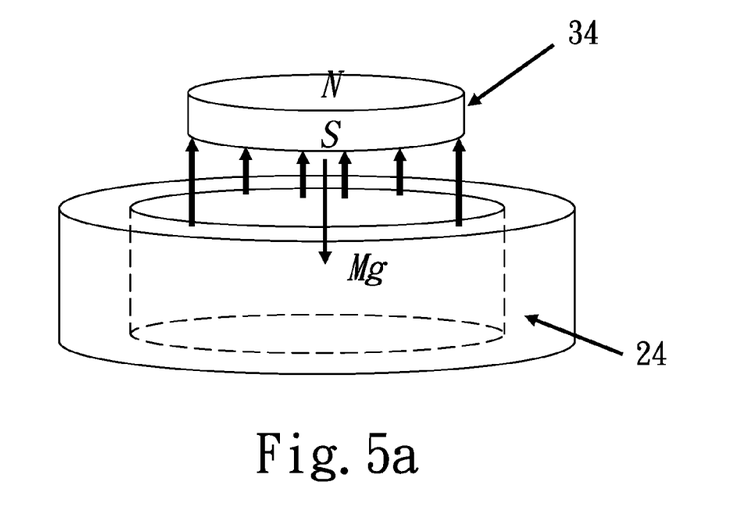
FIG. 5a shows the acting force between a cylindrical electromagnet and a round magnet.
Figure 5B:
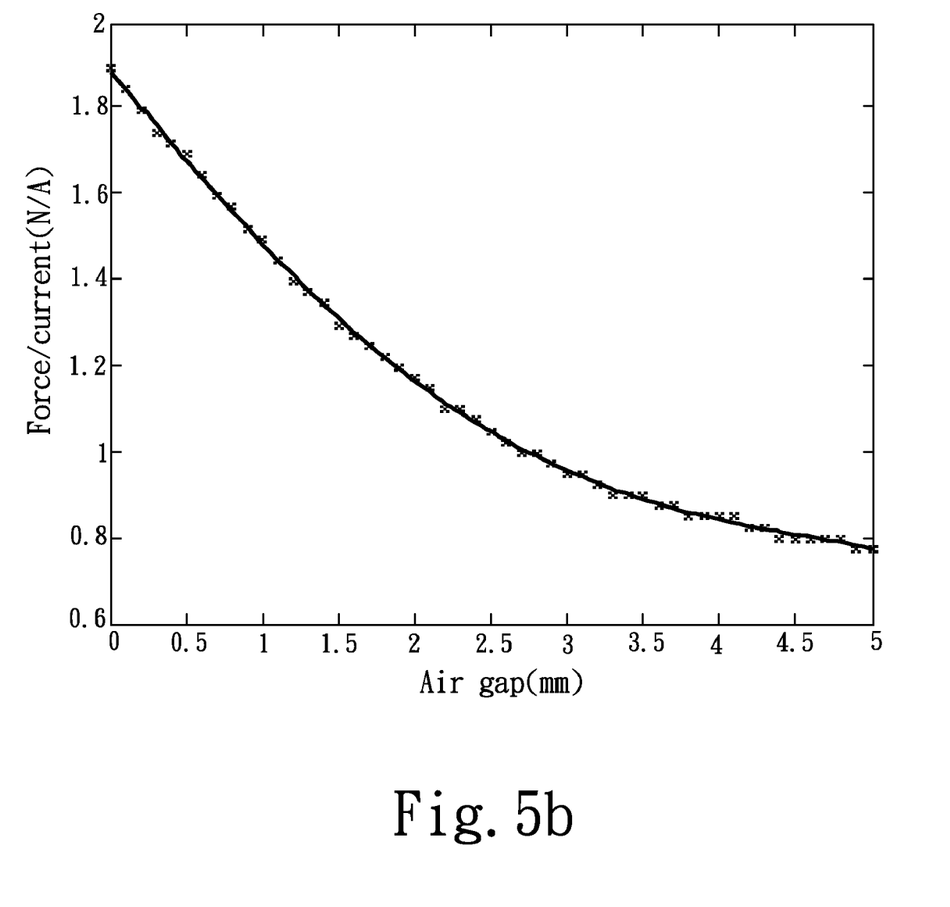
FIG. 5b is a curve showing the distribution of magnetic forces in a vertical direction.

FIG. 5a shows the acting force between a cylindrical electromagnet and a round magnet; and FIG. 5b is a curve showing the distribution of magnetic force in a vertical direction. Similarly, the same method is used to obtain the relational expression of $\vec{g}(x,y,z)$, which is the function of the relative position of the cylindrical electromagnet to the round magnet. The relational expression is as follow:

$$f_{cyl} \approx K_{cyl}(z) \cdot I_{cyl} \qquad (8)$$
$$\approx (k_{25}z^5 + k_{24}z^4 + k_{23}z^3 + k_{22}z^2 + k_{21}z + k_{20}) \cdot I_{cyl}$$

where, $k_{25}=1.4002\times10^{-4}$, $k_{24}=-3.3606\times10^{-3}$, $k_{23}=2.1592\times 10^{-2}$, $k_{22}=-1.9082\times10^{-3}$, $k_{21}=-4.2105\times10^{1}$, $k_{20}=1.8927$.

The objects to be achieved by the present invention and the strategies adopted by the present invention to achieve the objects are now briefly described as below:

1. Fast system response, to be achieved by:
   (A) Providing a novel and creative mechanism;
      To achieve the following two functions, fluid is employed in a positioning system for the first time:
      (a) Increasing the damping capacity of the overall system; and
      (b) Using buoyancy to counterbalance 90% weight of a platform of the system to thereby achieve the effect of low power consumption; and
   (B) Increasing the frequency of a controller of the system:
      A computer is used to control the whole system, and an overall control frequency as high as 300 Hz is adopted.
2. High-precision positioning performance, to be achieved by:
   Using a high-performance and powerful adaptive sliding controller.
3. Other practical designs:
   (A) For easy and convenient positioning of different devices on a carrier of the system, the present invention adopts levitation design instead of suspension design, and all the drivers are located below the carrier;
   (B) Hardware protection is provided to protect the platform against rapid falling and being damaged when the power is cut off and the levitation force disappears; and
   (C) Use programs to control slow-lowering procedures after completion of the positioning.

The present invention will now be described in more details as below. Please refer to FIG. 6 that is an exploded perspective view of a six-degree-of-freedom precision positioning system according to an embodiment of the present invention. As shown, the positioning system of the present invention includes a controller 2 and a platform 4. The platform 4 includes a hollow tank 10, a base 20, and a carrier 30. The hollow tank 10 is internally filled with a type of fluid 12, which may be aviation oil. The base 20 is disposed above the hollow tank 10, and is provided at predetermined positions with at least four through bores 22, at least four cylindrical electromagnets 24, and at least four rectangular electromagnets 26. Preferably, there are more than four through bores 22 symmetrically disposed on the base 20 around a center of the base 20. Similarly, there are preferably more than four cylindrical electromagnets 24 and more than four rectangular electromagnets 26 respectively symmetrically disposed on the base 20 around the center of the base 20. And, the number of the cylindrical electromagnets 24 is always the same as that of the rectangular electromagnets 26. The carrier 30 is located above a plurality of hollow columns 32 that are supported by the fluid 12 in the hollow tank 10. At least eight permanent magnets 34 are mounted to a lower surface of the carrier 30. The hollow columns 32 may be made of aluminum alloys, and the number of the hollow columns 32 is the same as that of the through bores 22 on the base. Please refer to FIG. 7 along with FIG. 6. There is a plurality of connecting members 36 being extended through the through bores 22 to connect the hollow columns 32 with the carrier 30. In the present invention, the permanent magnets 34 are neodymium-iron-boron (Nd—Fe—B) magnets, and are located at positions corresponding to the cylindrical electromagnets 24 and the rectangular electromagnets 26. Also, the number of the permanent magnets 34 is a sum of the cylindrical electromagnets 24 and the rectangular electromagnets 26.

According to another embodiment of the present invention, as shown in FIG. 4a, the permanent magnets 34 include an upper part and a lower part, and the upper part has a magnetic polarity different from that of the lower part. In this manner, a doubled magnetic force can be generated.

Figure 8:
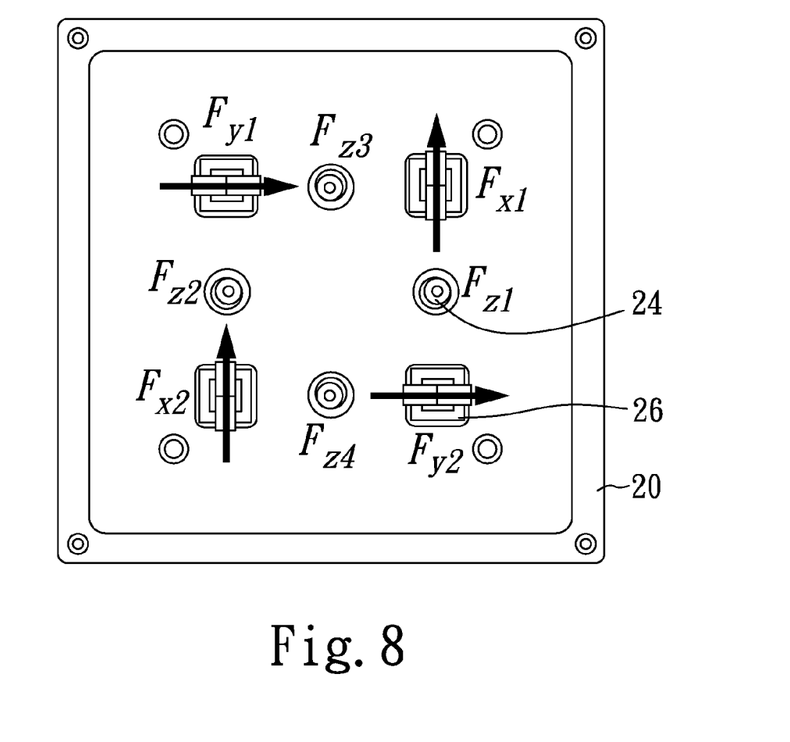
FIG. 8 shows an example of the arrangement of cylindrical electromagnets and rectangular electromagnets adopted in the present invention.
Figure 9A:
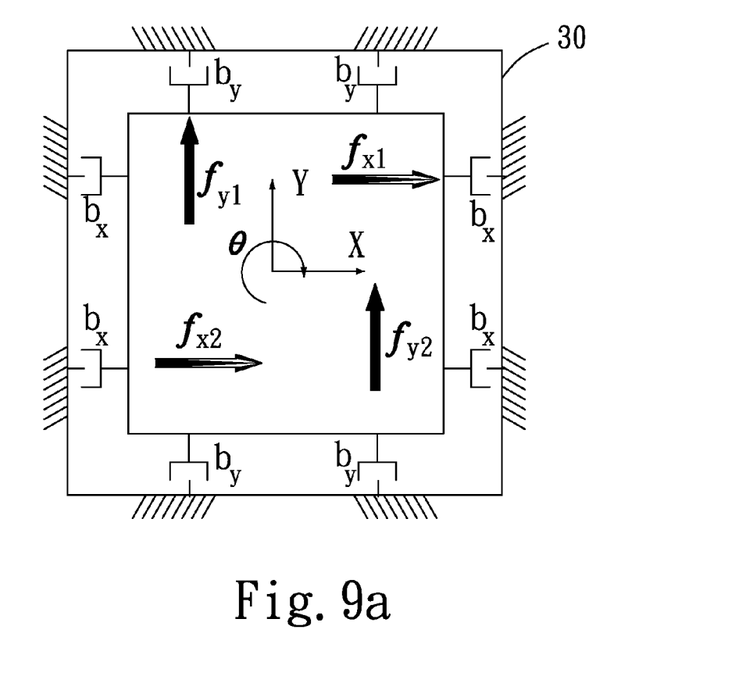
FIGS. 9a and 9b show the forces acted on the carrier in the present invention.
Figure 9B:
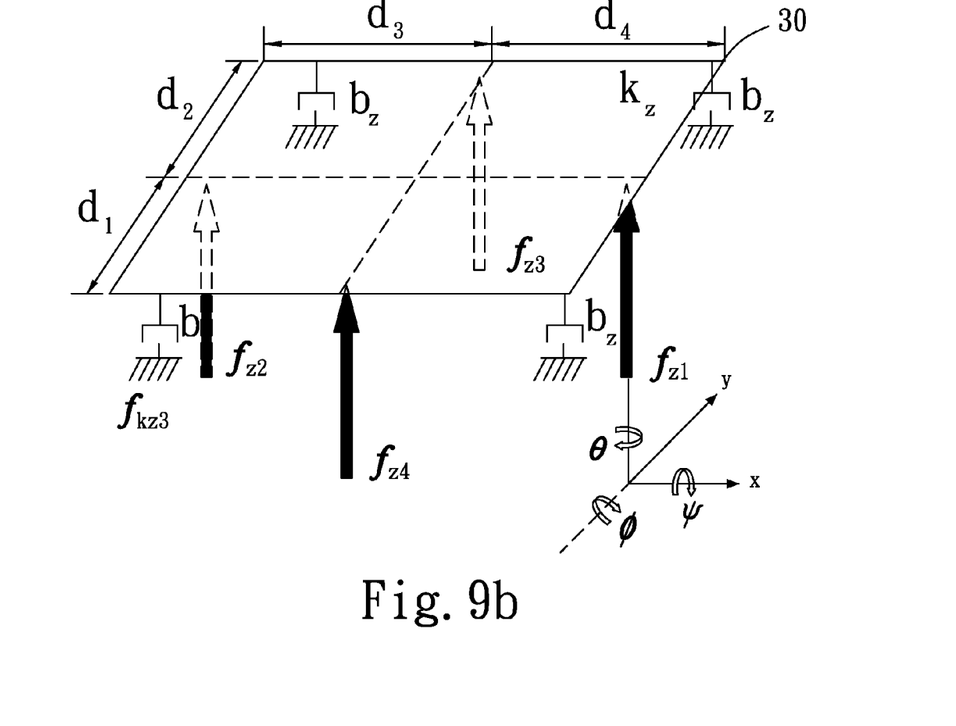

FIG. 8 shows an example of the arrangement of the cylindrical electromagnets 24 and the rectangular electromagnets 26 on the base 20. With the cylindrical electromagnets 24 and the rectangular electromagnets 26 arranged on the base 20 in the manner as shown in FIG. 8, magnetic forces acted on the carrier 30 in horizontal and vertical directions are shown in FIGS. 9a and 9b, respectively. The following explains how the dynamic equations for the system are derived.

Through Newton's second law, the eight magnetic forces shown in FIGS. 9a and 9b can be formulated to the following force equations and moment equations for a motion platform:

$$\Sigma F_x : M\ddot{x} = f_{x1} + f_{x2} - 4b_x\dot{x}$$

$$\Sigma F_y : M\ddot{y} = f_{y1} + f_{y2} - 4b_y\dot{y}$$

$$\Sigma F_z : M\ddot{z} = f_{z1} + f_{z2} + f_{z3} + f_{z4} - 4b_z\dot{z} - Mg$$

$$\Sigma \tau_\psi : I_{xx}\ddot{\psi} = (f_{z4} - f_{z3})d_b - b_\psi\dot{\psi} + 4b_y\dot{y}d_{couple}$$

$$\Sigma \tau_\phi : I_{yy}\ddot{\phi} = (f_{z2} - f_{z1})d_b - b_\phi\dot{\phi} + 4b_x\dot{x}d_{couple}$$

$$\Sigma \tau_\theta : I_{zz}\ddot{\theta} = (f_{x1} + f_{y1})d_a - (f_{x2} + f_{y2})d_a - b_\theta\dot{\theta}. \qquad (9)$$

where, M is the mass of the motion platform; g is the gravitational acceleration; and $I_{xx}$, $I_{yy}$, and $I_{zz}$ are the rotational inertia of the motion platform along X-axis, Y-axis, and Z-axis, respectively. The above equations may be rewritten in the form of matrix equation as follows:

$$\overline{M}\ddot{X} = A\dot{X} + B_dD + B_uU - G. \qquad (10)$$

where,
$\overline{M} \equiv \mathrm{diag}[M\ M\ M\ I_{xx}\ I_{yy}\ I_{zz}]$,
State vector $\dot{X} \equiv [\dot{x}\ \dot{y}\ \dot{z}\ \dot{\psi}\ \dot{\phi}\ \dot{\theta}]^T$,
Control vector $U \equiv [u_x\ u_y\ u_z\ u_\psi\ u_\phi\ u_\theta]^T$,
Air-gap vector $D \equiv [d_{x1}\ d_{x2}\ d_{y1}\ d_{y2}\ d_{z1}\ d_{z2}\ d_{z3}\ d_{z4}]^T$,
Gravity vector $G \equiv [0\ 0\ Mg\ 0\ 0\ 0]^T$.

Since some factors, such as errors in hardware fabrication, influences of temperature changes on coil impedance, etc., are ignored in the process of system modeling, there would be errors and variations in the parameters of the derived system dynamic model. Therefore, an adaptive controller is adopted in the present invention to compensate the influences from the errors and variations of the parameters of the dynamic model.

Figure 10:
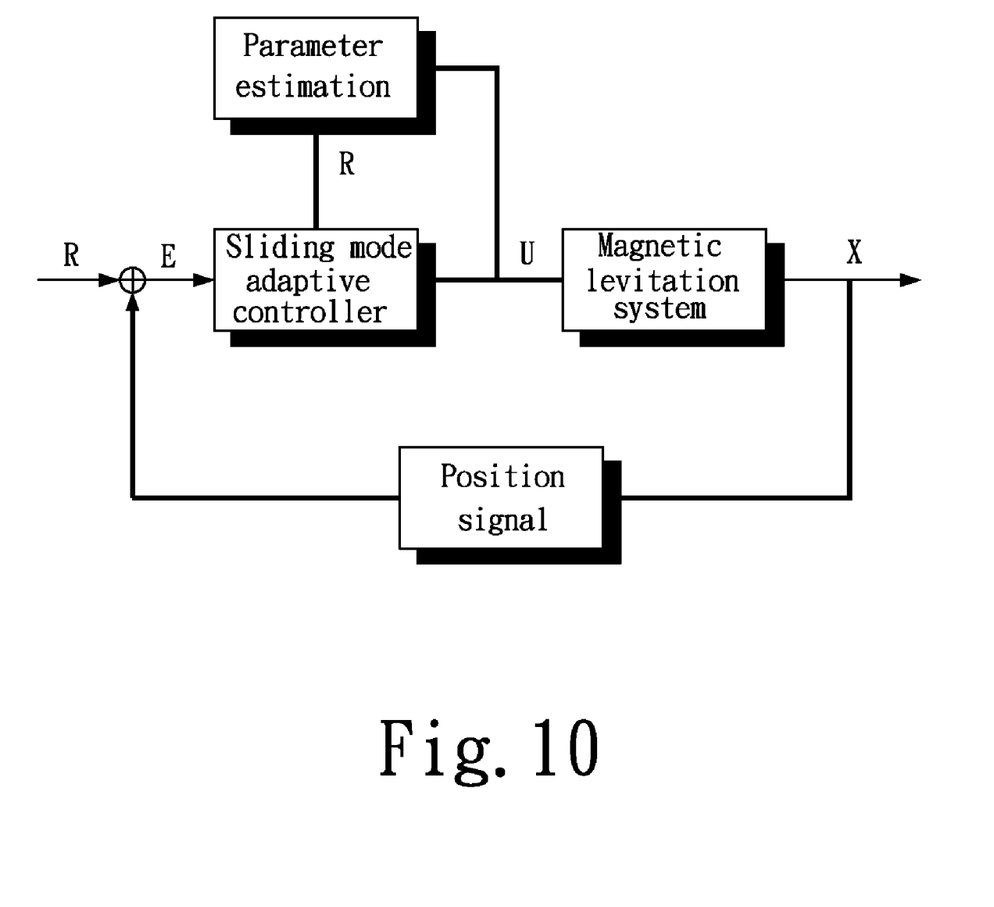
FIG. 10 is a block diagram showing the configuration of a system close-circuit controller for the present invention.

Moreover, for the purpose of increasing the system response speed, the Sliding Mode is employed in designing the controller of the present invention to increase the system ability to respond, as shown in FIG. 10.

To facilitate convenient design of the controller, the system dynamic model is first linearized and it is defined that the error variable E≡X−$X_d$, so that the above Equation (10) may be rewritten as below:

$$\overline{M}\ddot{E}=A\dot{X}+B_d D+B_u U_{Ctrl}-\overline{M}\ddot{X}_d, \quad (11)$$

where, $X_d$ is the intended positional trajectory, and $W_l$ represents the uncertain factors in the system.

The above equation (11) may be then further formulated as follows:

$$\overline{M}\ddot{E}=A\dot{X}+B_d D+B_u U_{Ctrl}-\overline{M}\ddot{X}_d+W. \quad (12)$$

Wherein, the defined W is further divided into two parts, one of which is the constant fluctuation $W_c$ and defined as mechanical errors in manufacture, and the other part is the time-varying fluctuation $W_v$ and defined as external noises. Thus, the above equation (12) may be further rewritten as below:

$$\overline{M}\ddot{E}=A\dot{X}+B_d D+B_u U_{AS}-\overline{M}\ddot{X}_d+W_c+W_v \quad (13)$$

wherein, it is assumed the varying uncertain factors $W_v$ is within a limited range, that is, $\|W_v\| \leq W_{max}$.

To increase the system ability to response, the sliding surface S is defined as below:

$$S=\dot{E}+\Lambda E \quad (14)$$

wherein, $\Lambda \equiv \mathrm{diag}[\lambda_1, \lambda_2, \lambda_3, \lambda_4, \lambda_5, \lambda_6]^T$, and $\forall \lambda_i > 0$.

Thereafter, the control input is designed as below:

$$U_{AS}=\hat{B}_{u0}^{-1}[-\hat{A}_0 \dot{X}-\hat{B}_{d0}D+\ddot{X}_d-\hat{W}_{c0}-\Lambda \dot{E}-KS-N\mathrm{sat}(S)] \quad (15)$$

where, $K \equiv \mathrm{diag}[k_1, k_2, k_3, k_4, k_5, k_6]^T$; $\forall k_i > 0$; $N \equiv \mathrm{diag}[\eta_1, \eta_2, \eta_3, \eta_4, \eta_5, \eta_6]^T$; $\forall \eta_i > 0$; $\|N\| \geq W_{max}$; $\hat{A}_0, \hat{B}_{u0}, \hat{B}_{d0}$ and $\hat{W}_{c0}$ are the estimated values of $A_0, B_{u0}, B_{d0}$ and $W_{c0}$ respectively; and finally, sat(.) is saturation function defined as below:

$$\mathrm{sat}(S)=[\mathrm{sat}(s_1),\mathrm{sat}(s_2),\mathrm{sat}(s_3),\mathrm{sat}(s_4),\mathrm{sat}(s_5),\mathrm{sat}(s_6)]^T \quad (16)$$

wherein, $$\mathrm{sat}(s_i) \equiv \begin{cases} 1 & s_i > \varepsilon_i \\ \frac{s_i}{|\varepsilon_i|} & \text{if } -\varepsilon_i \leq s_i \leq \varepsilon_i, \text{ and } \varepsilon \equiv [\varepsilon_1, \varepsilon_2, \varepsilon_3, \varepsilon_4, \varepsilon_5, \varepsilon_6]^T \\ -1 & s_i < -\varepsilon_i \end{cases}$$

is a margin setting parameter.

To obtain the estimation rules for parameter estimation, the Lyapunov Stability Analysis [24] is used. First, the Lyapunov function candidate V is designed to be:

$$V = \frac{1}{2}S^T S + \frac{1}{2}tr\left(\tilde{P}^T \Gamma_1^{-1} \tilde{P}\right) + \frac{1}{2}tr\left(\tilde{Q}^T \Gamma_2^{-1} \tilde{Q}\right) \quad (17)$$

where, both of $\Gamma_1^{-1}$ and $\Gamma_2^{-1}$ are positive definite diagonal matrixes. Then, differentiate the above equation (17) with respect to time to obtain the following:

$$\dot{V}=S^T \dot{S}+tr(\tilde{A}_0^T \Gamma_1^{-1}[/\$]\$\~\$\$[/\$]\$\~ A\tilde{P}\tilde{A}_0)+tr$$
$$(\tilde{B}_{d0}^T \Gamma_2^{-1}[/\$]\$\~\$\$[/\$]\$\~ A\tilde{P}\tilde{B}_{d0})+tr(\tilde{B}_{u0}^T \Gamma_3^{-1}$$
$$1[/\$]\$\~\$\$[/\$]\$\~ A\tilde{P}\tilde{B}_{u0})+tr(\tilde{W}_{c0}^T \Gamma_4^{-1}[/\$]$$
$$\$\~\$\$[/\$]\$\~ A\tilde{P}\tilde{W}_{c0}), \quad (18)$$

Then, substitute the above equations (14) and (15) into the equation (18). After a large quantity of matrix operation, a simplified result as follows is obtained:

$$\dot{V} = -S^T KS - S^T(N\mathrm{sat}(S) - W_{v0}) + \quad (19)$$
$$tr\left[\tilde{A}_0^T \left(\Gamma_1^{-1}\dot{\tilde{A}}_0 + S\dot{X}^T\right)\right] + tr\left[\tilde{B}_{d0}^T\left(\Gamma_2^{-1}\dot{\tilde{B}}_{d0} + SD^T\right)\right] +$$
$$tr\left[\tilde{B}_{u0}^T\left(\Gamma_3^{-1}\dot{\tilde{B}}_{u0} + SU_{AS}^T\right)\right] + tr\left[\tilde{W}_{c0}^T\left(\Gamma_4^{-1}\dot{\tilde{W}}_{c0} + S\right)\right].$$

Based on the theory of Lyapunov Stability Analysis, the above equation (19) must be smaller than zero or equal to zero for the system to be stable. Therefore, the estimation rule for parameter estimation in the present invention may be derived as below:

$$-[/\$]\$\~\$\$[/\$]\$\~ A\tilde{P}\tilde{A}_0 = [/\$]\$\~\$\$[/\$]$$
$$\$\~ A\hat{P}\hat{A}_0 = \Gamma_1 S\dot{X}^T - \Gamma_1 \Sigma_1 \hat{A}_0,$$

$$-[/\$]\$\~\$\$[/\$]\$\~ A\tilde{P}\tilde{B}_{d0} = [/\$]\$\~\$\$[/\$]$$
$$\$\~ A\hat{P}\hat{B}_{d0} = \Gamma_2 SD^T - \Gamma_2 \Sigma_2 \hat{B}_{d0},$$

$$-[/\$]\$\~\$\$[/\$]\$\~ A\tilde{P}\tilde{B}_{u0} = [/\$]\$\~\$\$[/\$]$$
$$\$\~ A\hat{P}\hat{B}_{u0} = \Gamma_3 SU_{AS}^T - \Gamma_3 \Sigma_3 \hat{B}_{u0},$$

$$-[/\$]\$\~\$\$[/\$]\$\~ A\tilde{P}\tilde{W}_{c0} = [/\$]\$\~\$\$[/\$]$$
$$\$\~ A\hat{P}\hat{W}_{c0} = \Gamma_4 S - \Gamma_4 \Sigma_4 \hat{W}_{c0}. \quad (20)$$

Therefore, with the system parameter estimation rule and the controller design derived from the above theory, it is able to prove according to BarBalat's Lemma that the state variables of the system may be converged to zero.

Figure 6:
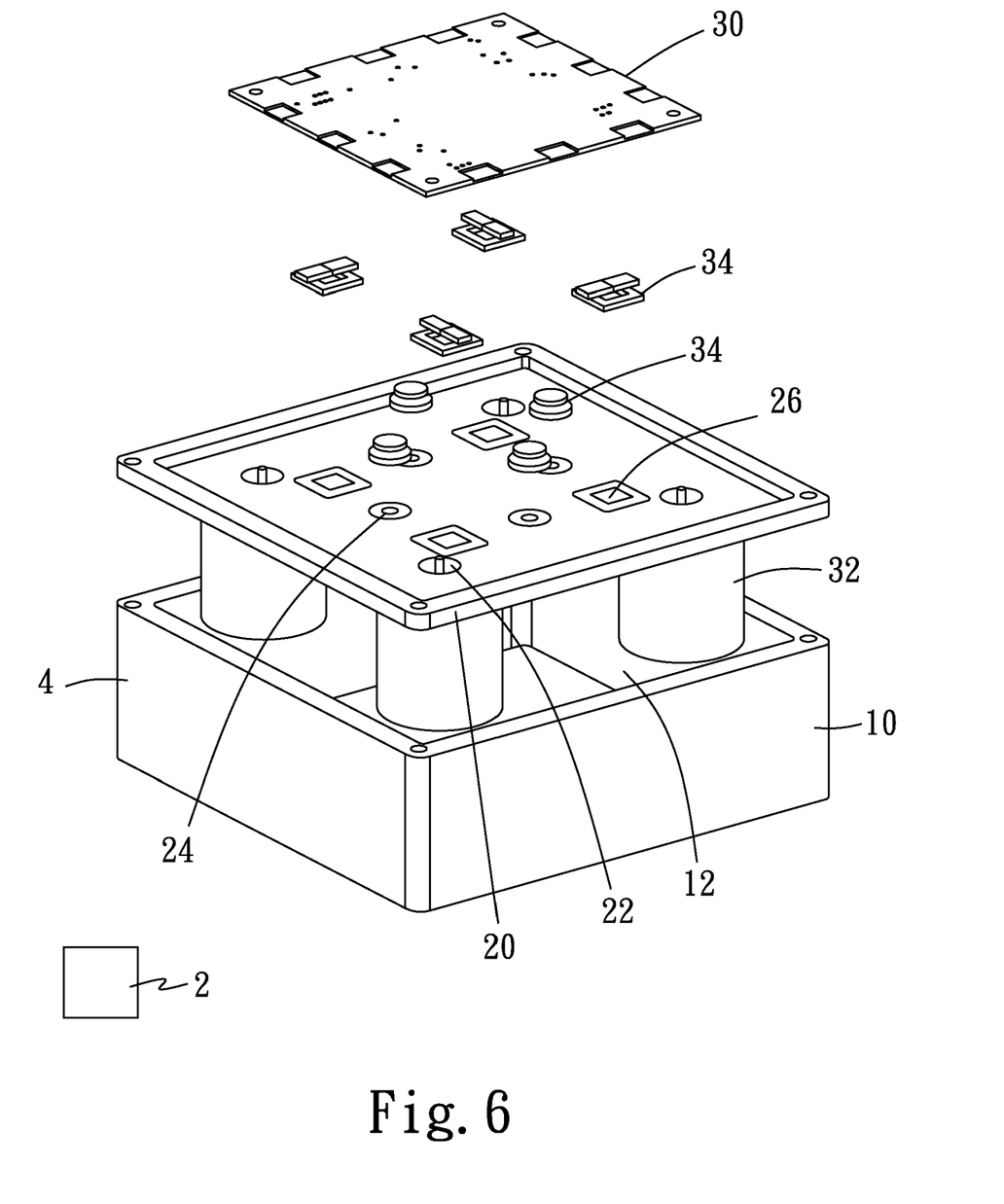
FIG. 6 is an exploded perspective view of a six-degree-of-freedom precision positioning system according to the present invention.
Figure 7:
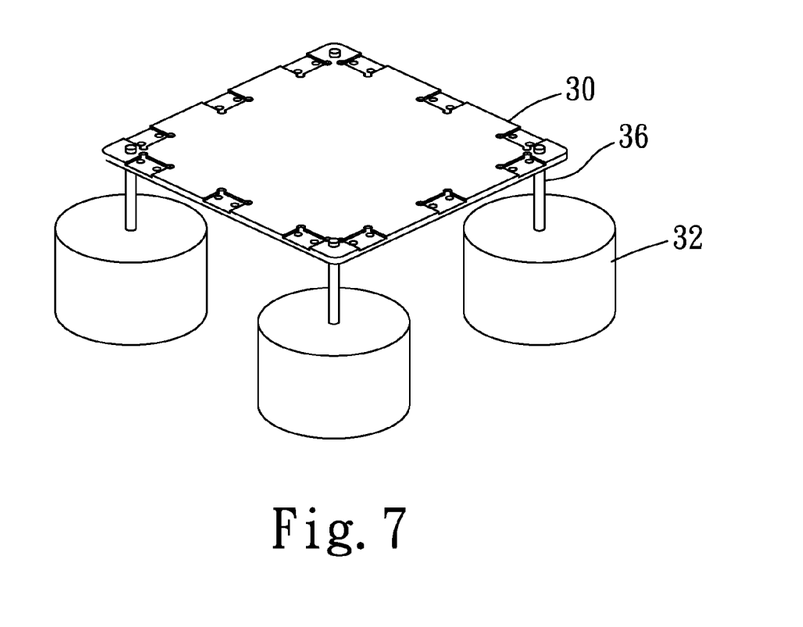
FIG. 7 is a perspective view showing a carrier included in the present invention.

Since the carrier 30 is connected with the hollow columns 32, the carrier 30 is acted not only by magnetic force, but also by the buoyancy of the fluid 12. There are two advantages in utilizing the properties of fluid. First, the fluid provides buoyancy that counterbalances 90% of the weight of the platform. Therefore, small-scale coils may be used to generate sufficient force for driving the platform to move, and the system can be low power consumption. Second, with the properties of fluid, the whole system may have enhanced damping capacity, making the system more easily controllable. As a result, the problems of high power consumption and uneasy to control in the conventional magnetically levitated positioning platform can be overcome.

Finally, with the adaptive sliding controller particularly derived for the positioning system of the present invention, the positioning system of the present invention is able to satisfy the requirements of high precision positioning and fast response. When it is desired to expand the motion range of the platform, a user needs only to install sensors with increased measuring range and to properly increase the inner diameter of the coils and the size of the permanent magnets. Therefore, the mechanism design for the present invention is highly flexible to allow system upgrade and application in different fields.

What is claimed is:

1. A six-degree-of-freedom precision positioning system comprising a controller and a platform; the platform including:
   a hollow tank being filled with a type of fluid;
   a base being disposed above the hollow tank and having at least four through bores symmetrically formed thereon around a center of the base;
   at least four cylindrical electromagnets and at least four rectangular electromagnets being symmetrically disposed on the base around the center of the base;

a carrier being located above a plurality of hollow columns that are supported by the fluid in the hollow tank; and the number of the hollow columns being the same as that of the through bores on the base; and at least eight permanent magnets being mounted to a lower surface of the carrier at positions corresponding to the cylindrical electromagnets and the rectangular electromagnets.

2. The system as claimed in claim 1, wherein the fluid is a liquid.

3. The system as claimed in claim 2, wherein the liquid is aviation oil.

4. The system as claimed in claim 1, wherein the number of the through bores is larger than four.

5. The system as claimed in claim 1, wherein the number of the cylindrical electromagnets and the number of the rectangular electromagnets are the same and larger than four; and the number of the permanent magnets is equal to a sum of the cylindrical and the rectangular electromagnets.

6. The system as claimed in claim 1, wherein the permanent magnets are neodymium-iron-boron (Nd—Fe—B) magnets.

7. The system as claimed in claim 1, wherein the hollow columns are made of aluminum alloys.

8. The system as claimed in claim 1, wherein the permanent magnets include an upper and a lower part, and the upper part has a magnetic polarity different from that of the lower part.

9. The system as claimed in claim 1, wherein the controller includes a processing unit having a sampling rate of at least 300 Hz.

10. The system as claimed in claim 1, further comprising a plurality of connecting members, which are extended through the through bores on the base to connect the hollow columns with the carrier.

* * * * *